(12) United States Patent
Chiu

(10) Patent No.: US 11,658,152 B1
(45) Date of Patent: May 23, 2023

(54) DIE BONDING STRUCTURE, STACK STRUCTURE, AND METHOD OF FORMING DIE BONDING STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 84 days.

(21) Appl. No.: 17/453,650

(22) Filed: Nov. 5, 2021

(51) Int. Cl.
  *H01L 23/48* (2006.01)
  *H01L 23/52* (2006.01)
  *H01L 29/40* (2006.01)
  *H01L 25/065* (2023.01)
  *H01L 23/00* (2006.01)
  *H01L 21/78* (2006.01)
  *H01L 25/00* (2006.01)

(52) U.S. Cl.
  CPC .......... *H01L 25/0655* (2013.01); *H01L 21/78* (2013.01); *H01L 23/564* (2013.01); *H01L 24/05* (2013.01); *H01L 24/08* (2013.01); *H01L 25/50* (2013.01); *H01L 2224/05647* (2013.01); *H01L 2224/08137* (2013.01)

(58) Field of Classification Search
  CPC combination set(s) only.
  See application file for complete search history.

(56) References Cited

U.S. PATENT DOCUMENTS

| | | | |
|---|---|---|---|
| 10,504,852 B1* | 12/2019 | Chen | H01L 25/0657 |
| 11,158,606 B2* | 10/2021 | Gao | H01L 25/0657 |
| 11,276,676 B2* | 3/2022 | Enquist | H01L 25/074 |
| 11,385,278 B2* | 7/2022 | DeLaCruz | H01L 23/573 |
| 2012/0241981 A1* | 9/2012 | Hirano | H01L 23/562 257/777 |
| 2014/0084445 A1* | 3/2014 | Lin | H01L 23/3677 438/122 |
| 2015/0194455 A1* | 7/2015 | Ho | H01L 27/14634 438/109 |
| 2016/0343679 A1* | 11/2016 | Chen | H01L 24/05 |
| 2017/0186732 A1* | 6/2017 | Chu | H01L 24/82 |
| 2018/0175012 A1* | 6/2018 | Wu | H01L 25/50 |
| 2019/0131255 A1* | 5/2019 | Teng | H01L 24/94 |
| 2019/0273108 A1* | 9/2019 | Sato | H01L 27/1469 |

* cited by examiner

*Primary Examiner* — Niki H Nguyen
(74) *Attorney, Agent, or Firm* — CKC & Partners, LLC

(57) ABSTRACT

A die bonding structure includes a first die and a second die. The first die includes a first sealing ring and a plurality of first metal contacts, wherein sidewalls of the first metal contacts align a sidewall of the first sealing ring. The second die includes a second sealing ring and a plurality of second metal contacts, wherein sidewalls of the second metal contacts align a sidewall of the second sealing ring. The first metal contacts are directly bonded to the second metal contacts, respectively, and the first sealing ring is directly bonded to the second sealing ring.

20 Claims, 17 Drawing Sheets

DIE BONDING STRUCTURE, STACK STRUCTURE, AND METHOD OF FORMING DIE BONDING STRUCTURE

BACKGROUND

Field of Invention

The present invention relates to a die bonding structure, a stack structure, and a method of forming the die bonding structure.

Description of Related Art

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

An aspect of the invention provides a die bonding structure, which includes a first die and a second die. The first die includes a first sealing ring and a plurality of first metal contacts, wherein sidewalls of a first group of the first metal contacts align a first sidewall of the first sealing ring. The second die includes a second sealing ring and a plurality of second metal contacts, wherein sidewalls of the second metal contacts align a sidewall of the second sealing ring. The first group of the first metal contacts are directly bonded to the second metal contacts, respectively, and the first sealing ring is directly bonded to the second sealing ring.

According to some embodiments, the first sealing ring and the second sealing ring have the same material.

According to some embodiments, the first sealing ring and the second sealing ring include SiN or SiCN.

According to some embodiments, the first die and the second die are laterally bonded.

According to some embodiments, the first metal contacts and the second metal contacts include Cu.

According to some embodiments, the first die has an IC device encircled by the first sealing ring.

According to some embodiments, the second die has an IC device encircled by the second sealing ring.

According to some embodiments, the first die and the second die have different sizes.

According to some embodiments, the first die and the second die have different layouts.

According to some embodiments, the die bonding structure further includes a third die. The third die includes a third sealing ring and a plurality of third metal contacts. Sidewalls of the third metal contacts align a sidewall of the third sealing ring, and the third sealing ring is directly bonded to the first sealing ring.

According to some embodiments, sidewalls of a second group of the first metal contacts align a second sidewall of the first sealing ring, and the second group of the first metal contacts are directly bonded to the third metal contacts, respectively.

An aspect of the invention provides a stack structure, which includes a printed circuit board, a first die, and a second die. The first die is disposed on the printed circuit board and includes a first sealing ring and a plurality of first metal contacts. The second die is disposed on the printed circuit board and includes a second sealing ring and a plurality of second metal contacts. The first sealing ring is directly bonded to the second sealing ring, and the first metal contacts are directly bonded to the second metal contacts, respectively. A bonding direction of the first die and the second die is perpendicular to a normal direction of the printed circuit board.

According to some embodiments, the first die and the second die have different sizes.

According to some embodiments, the first die and the second die have different layouts.

According to some embodiments, the first sealing ring and the second sealing ring comprise SiN or SiCN.

According to some embodiments, the first metal contacts and the second metal contacts comprise Cu.

An aspect of the invention provides a method of forming a die bonding structure. A first wafer is cut to provide a first die, wherein a first sealing ring and a plurality of first metal contacts are exposed from a sidewall of the first die after cutting the first wafer. A second wafer is cut to provide a second die, wherein a second sealing ring and a plurality of second metal contacts are exposed from a sidewall of the second die after cutting the second wafer. The first sealing ring is bonded to the second sealing ring, and the first metal contacts are bonded to the second metal contacts.

According to some embodiments, the first wafer is cut by performing a laser cutting, and the laser cutting aligns a sidewall of the first sealing ring.

According to some embodiments, the second wafer is cut by performing a laser cutting, and the laser cutting aligns a sidewall of the second sealing ring.

According to some embodiments, the method further includes pre-cutting the first wafer and the second wafer by a blade.

According to some embodiments of the invention, the dies can be laterally bonded side-by-side via the metal contacts including Cu. The pitch joint can be well controlled by the layout. Additionally, the dies are cut by a blade cutting and a laser cutting, such that the sidewall of the dies are smooth and are benefit to the hybrid bonding process.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
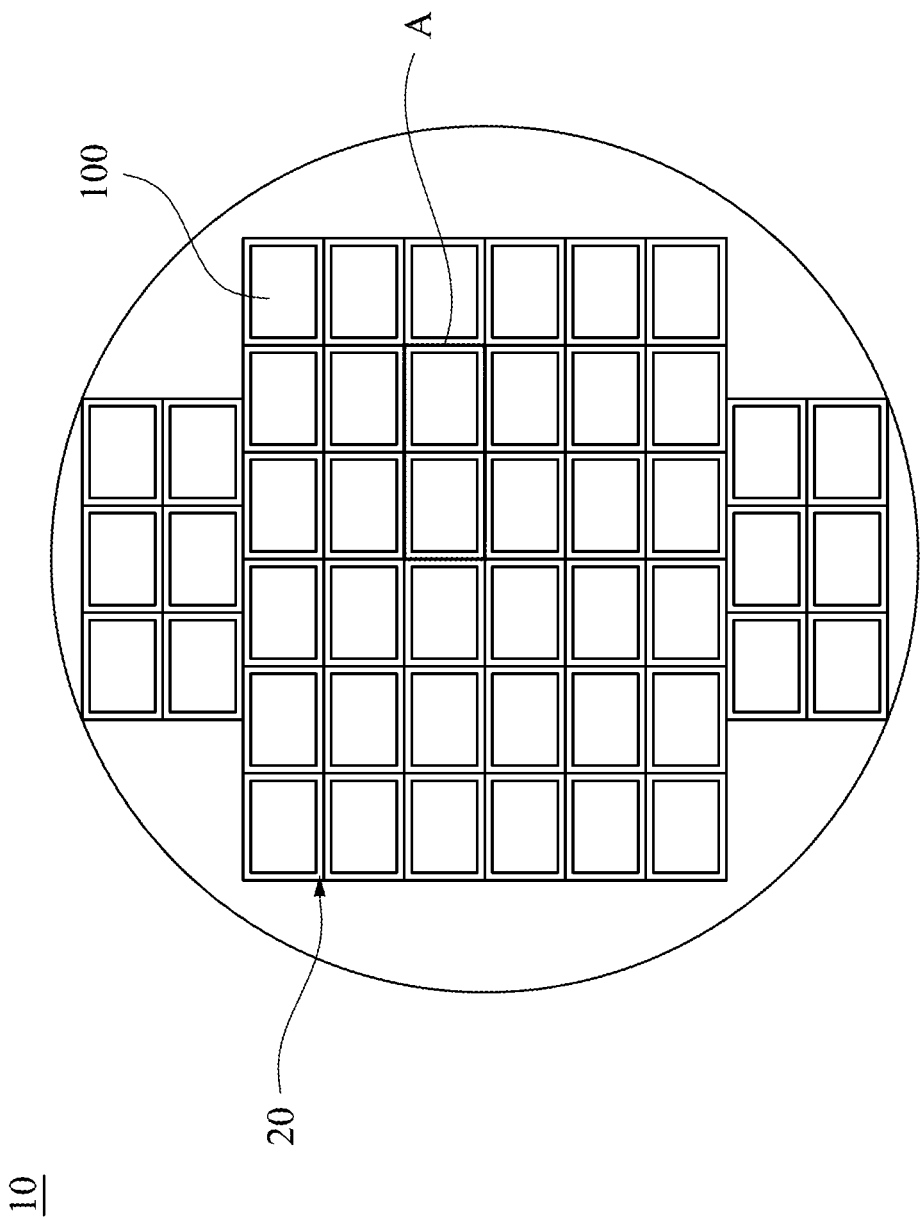
FIG. 1 is a top view of a wafer according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is made to FIG. 1, which is a top view of a wafer according to some embodiments of the disclosure. A wafer 10 having a semiconductor substrate is provided. In some embodiments, the wafer 10 includes a silicon substrate. The wafer 10 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the silicon substrate is a base material on which processing is conducted to provide layers of material to form various features of integrated circuit (IC) devices. For the sake of clarity to better understand the inventive concepts of the present disclosure, features of the IC devices have been simplified.

The wafer 10 is then cut into a plurality of dies 100. The wafer 10 is cut along scribe lines 20. Namely, after the wafer 10 is cut along the scribe lines 20, the dies 100 are provided. The layouts of the dies 100 may be substantially the same in the wafer 10.

Figure 2:
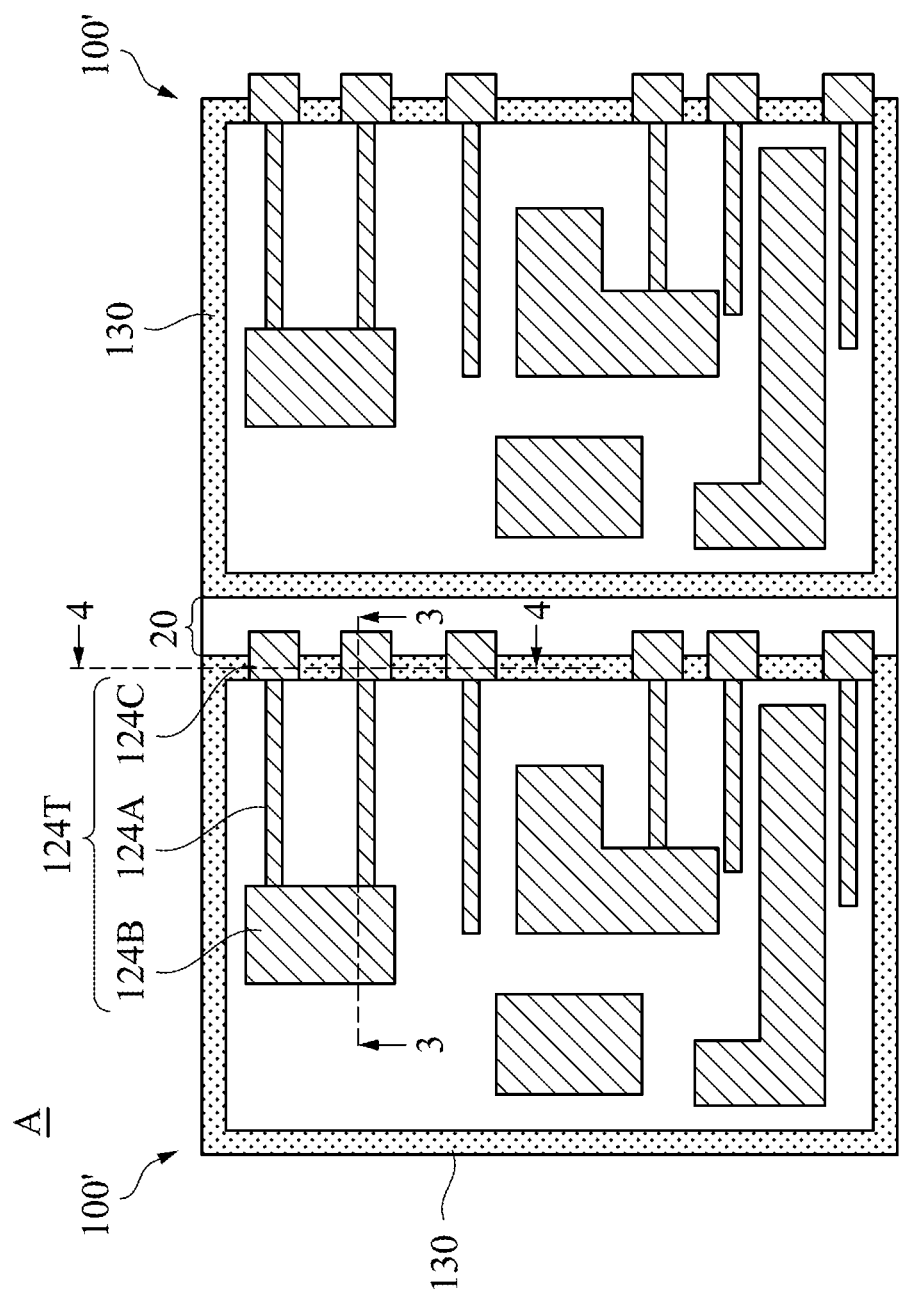
FIG. 2 is a schematic top view of the area A of the wafer in the FIG. 1.
Figure 3:
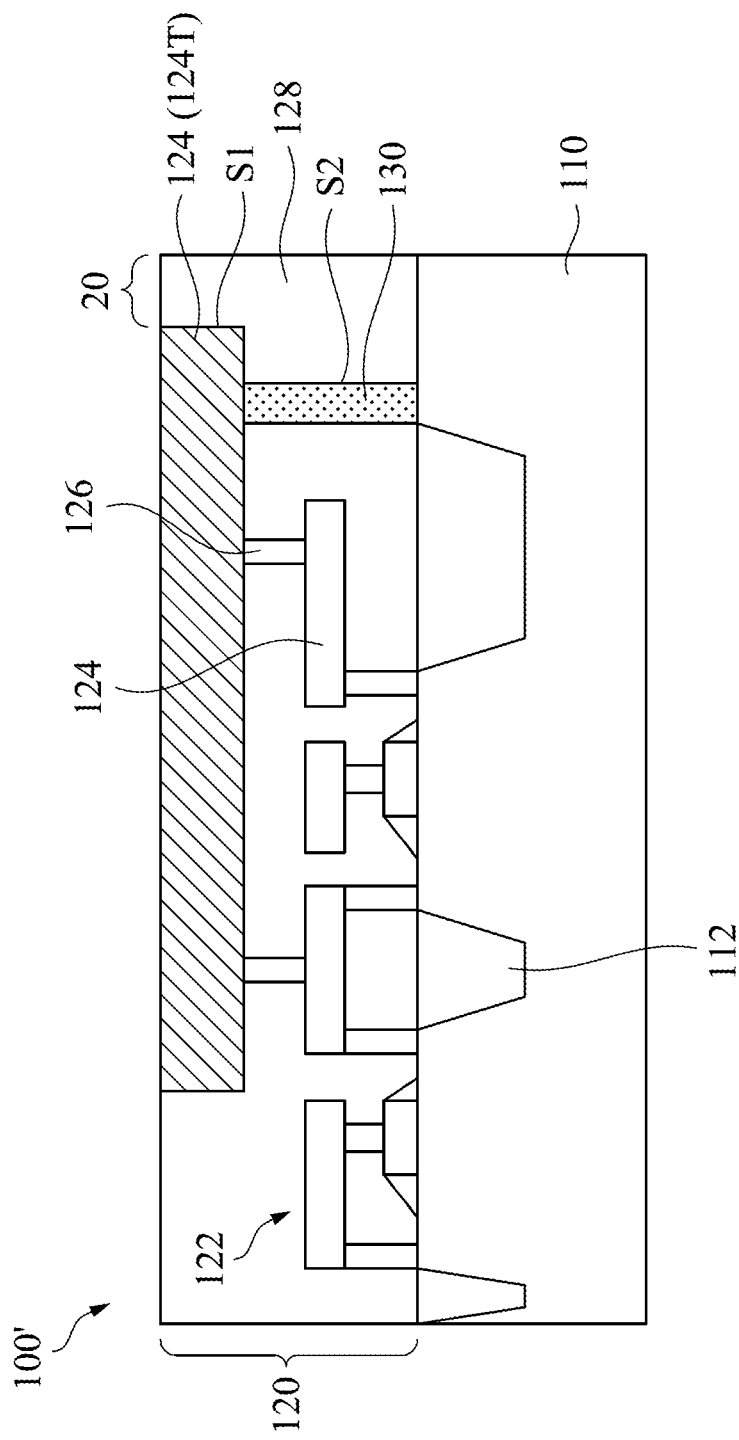
FIG. 3 is a cross-sectional view of FIG. 2 taken along line 3-3.
Figure 4:
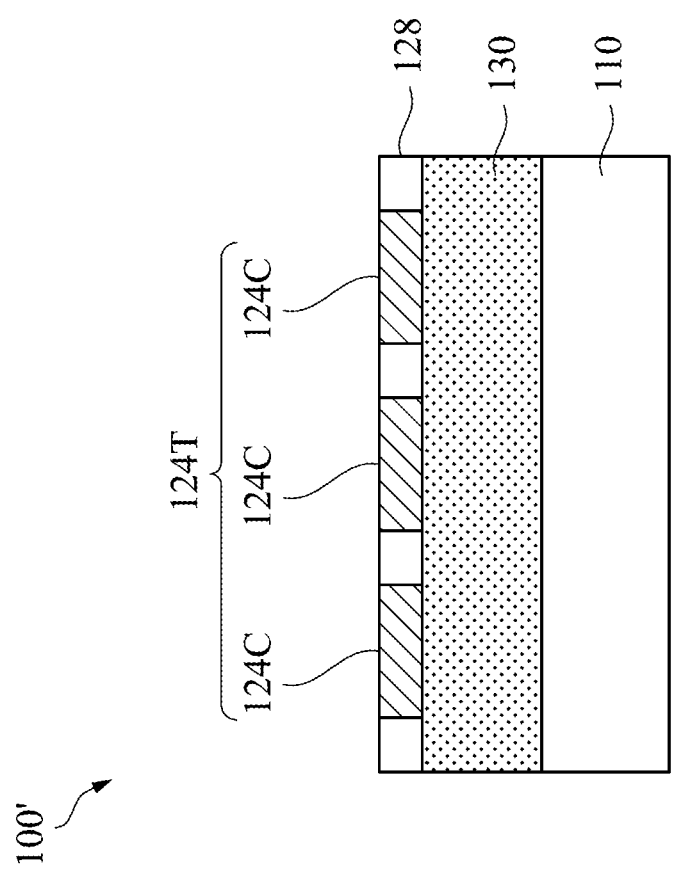
FIG. 4 is a cross-sectional view of FIG. 2 taken along line 4-4.

Reference is made to FIGS. 2-4, in which FIG. 2 is a schematic top view of the area A of the wafer in the FIG. 1, FIG. 3 is a cross-sectional view of FIG. 2 taken along line 3-3, and FIG. 4 is a cross-sectional view of FIG. 2 taken along line 4-4. Each of the region corresponding to the die 100 (hereafter as die region 100') includes a silicon substrate 110 and at least one device layer 120 formed on the silicon substrate 110. The device layer 120 has a plurality of integrated circuit (IC) devices 122 include an active component such as a transistor, a switch, etc., and/or a passive component, such as a resistor, capacitor, inductor, transformer, etc.

A plurality of isolation elements 112 are formed embedded in the silicon substrate 110, thereby electrically isolating the adjacent IC devices 122. In some embodiments, the device layer 120 includes more than one metal layers 124 and a plurality of interconnection components 126, and the metal layers 124 are interconnected by the interconnection components 126. The device layer 120 further includes a dielectric layer 128. The dielectric layer 128 is disposed on the silicon substrate 110 and surrounding the IC devices 122, the metal layers 124, and the interconnection components 126.

In some embodiments, the metal layers 124 includes metal lines 124A, metal pads 124B, and metal contacts 124C, and the interconnection components 126 can be vias or plugs. The metal layers 124 and the interconnection components 126 can be metal such as copper (Cu), and the metal layers 124, and the interconnection components 126 can be formed by a series of Cu damascene processes. For easily understanding, the numbers of the IC devices 122, the metal layers 124, and the interconnection components 126 have been simplified in the drawings.

More particularly, the metal layers 124 includes a topmost metal layer 124T, in which a top surface of the topmost metal layer 124T is exposed from the dielectric layer 128, and a thickness of the topmost metal layer 124T is greater than a thickness of the rest of the metal layers 124. The topmost metal layer 124T includes the metal lines 124A, the metal pads 124B, and the metal contacts 124C. The metal contacts 124C are arranged adjacent the scribe line 20. The area of each of the metal pads 124B is greater than the area of each of the metal contacts 124C, and the shapes and sizes of the metal pads 124B can be different. Some of the metal pads 124B can be connected to the metal contacts 124C by the metal lines 124A. The metal pads 124B can be electrically connected to the underneath metal layer 124 by the interconnection components 126, and the metal pads 124B can be electrically connected to the IC devices 122. Therefore, the IC devices 122 can be controlled or communicated to the peripheral through the metal layers 124 and the interconnection components 126.

The die region 100' further includes a sealing ring 130 disposed in the device layer 120. The sealing ring 130 can be a rectangle shape in a top view, and the sealing ring 130 is arranged at the peripheral of the die region 100', thereby encircling the IC devices 122. At the section of the sealing ring 130 under the topmost metal layer 124T, the top surface of the section of the sealing ring 130 is in contact with the bottom surface of the topmost metal layer 124T, and the bottom surface of the section of the sealing ring 130 is in contact with the top surface of the silicon substrate 110. At some other sections of the sealing ring 130, the sections of the sealing ring 130 interpose the dielectric layer 128, in which the top surface of the sections of the sealing ring 130 is exposed from the dielectric layer 128, and the bottom surface of the sealing ring 130 is in contact with the top surface of the silicon substrate 110. Therefore, the sealing ring 130 can protect the IC devices 122 from be damaged in the following manufacturing processes.

In some embodiments, the sealing ring 130 misaligns the metal contacts 124C. For example, each of the metal contacts 124C has a first outer surface S1 facing the scribe line 20, the sealing ring 130 has a second outer surface S2 facing the scribe line 20, and the first outer surface S1 misaligns the second outer surface S2. More particularly, the first outer surface S1 of the metal contact 124C is closer to the scribe line 20 than the second outer surface S2 of the sealing ring 130. Namely, the metal contacts 124C are protruded from the sealing ring 130. The material of the sealing ring 130 can be different from the material of the dielectric layer 128. For example, the material of the sealing ring 130 can be SiN or SiCN, and the material of the dielectric layer 128 can be SiO$_2$.

Figure 10:
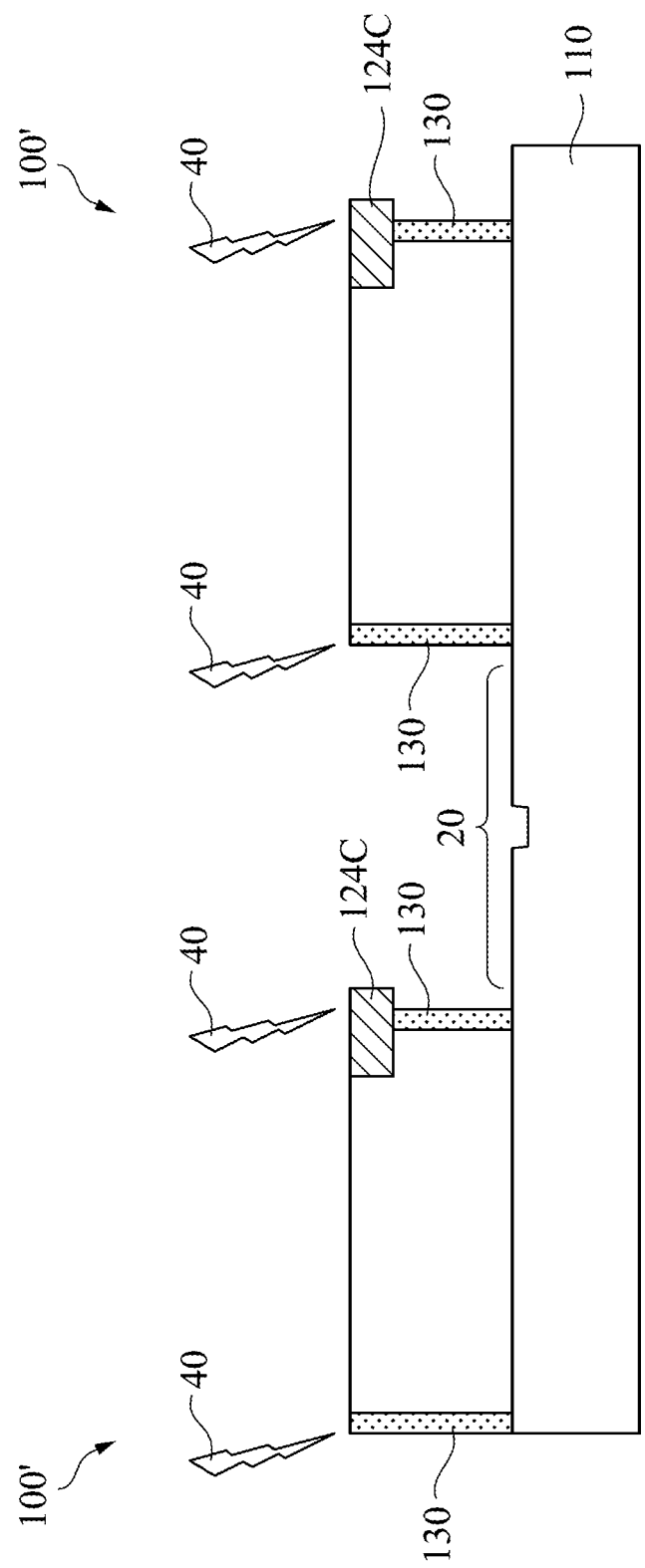
Figure 11:
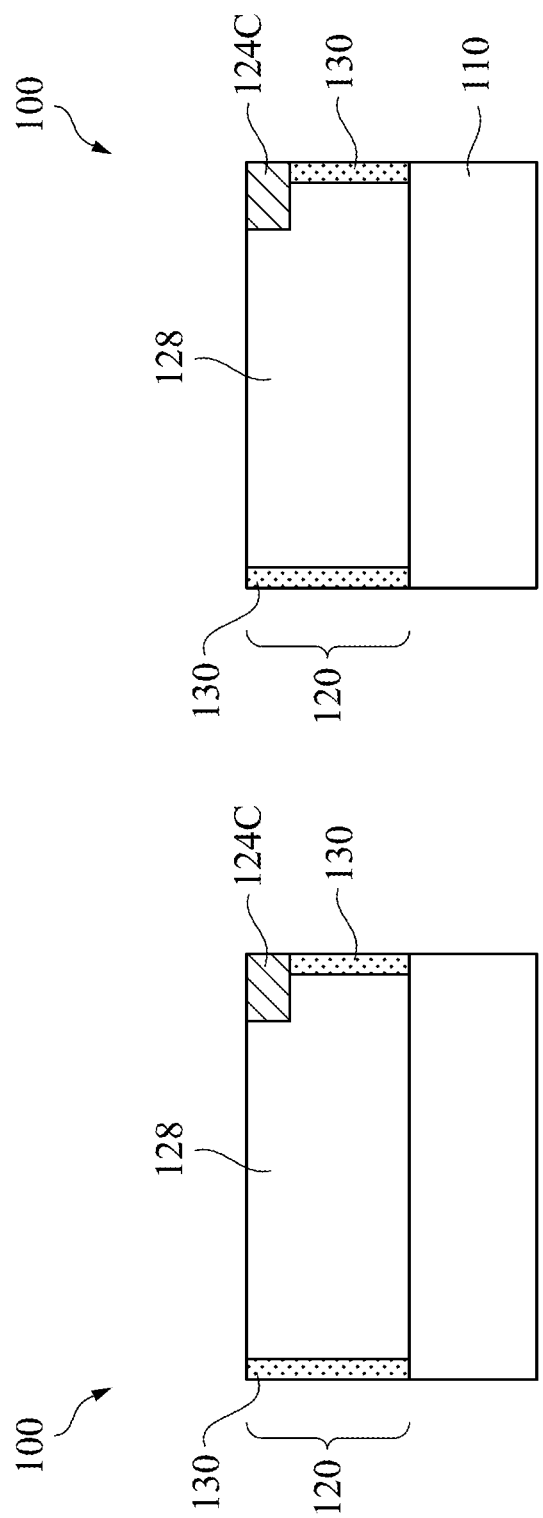
Figure 12A:
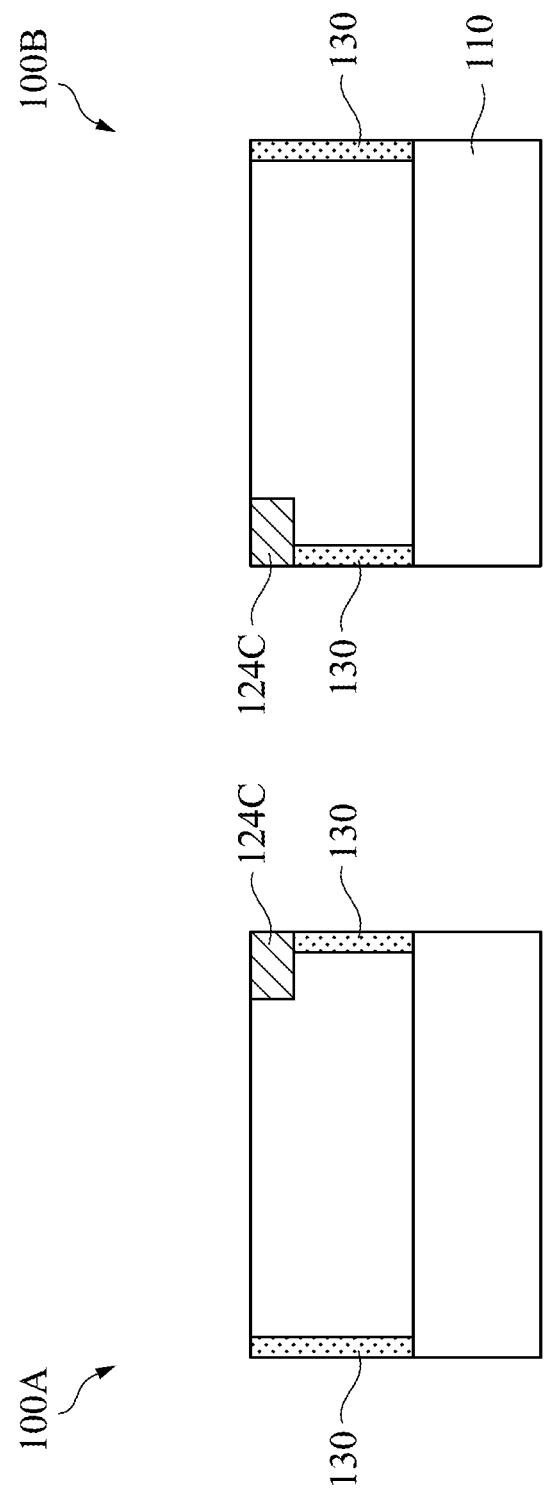
Figure 12B:
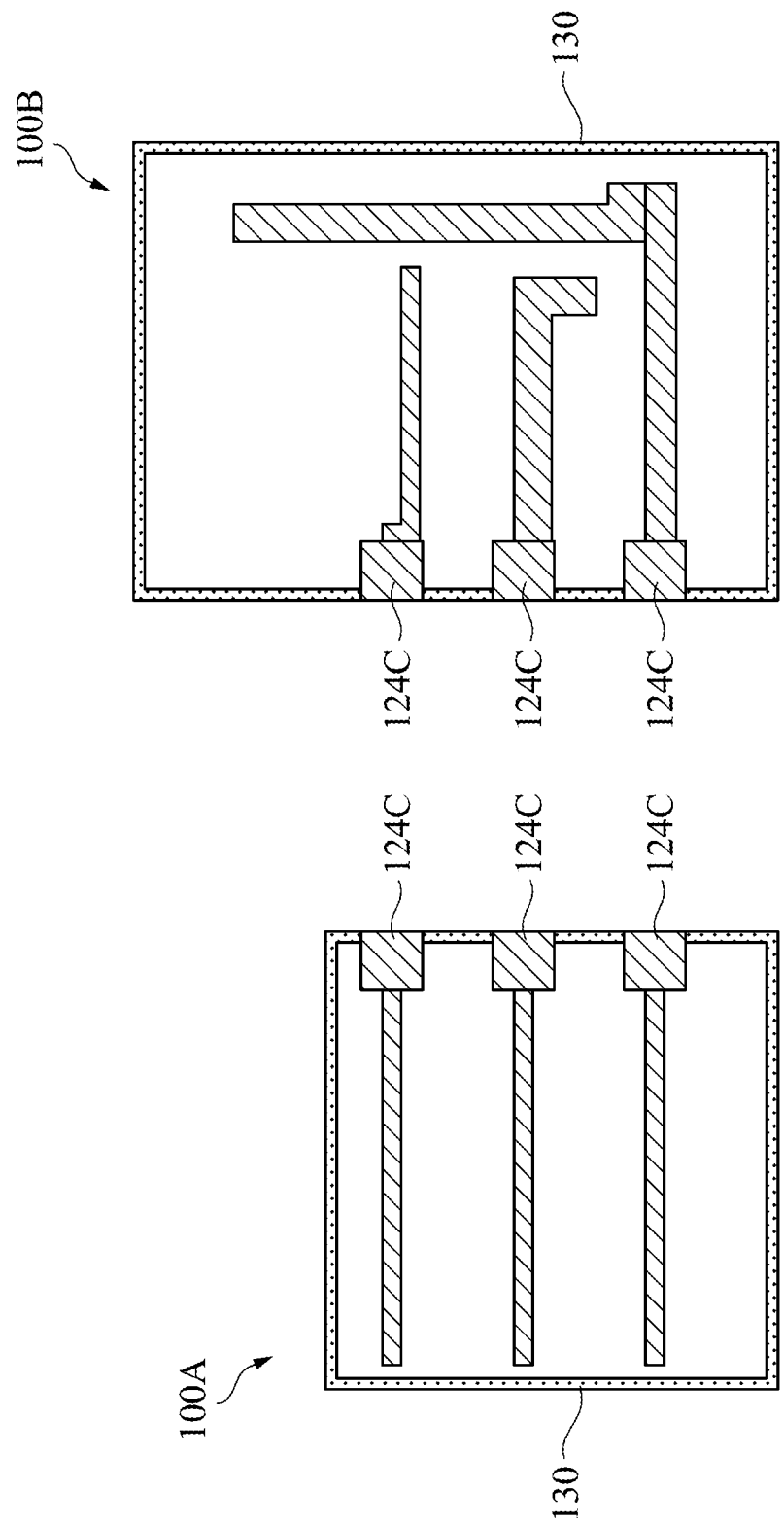
FIG. 12B and FIG. 13B respective are schematic top views of FIG. 12A and FIG. 13A.
Figure 13A:
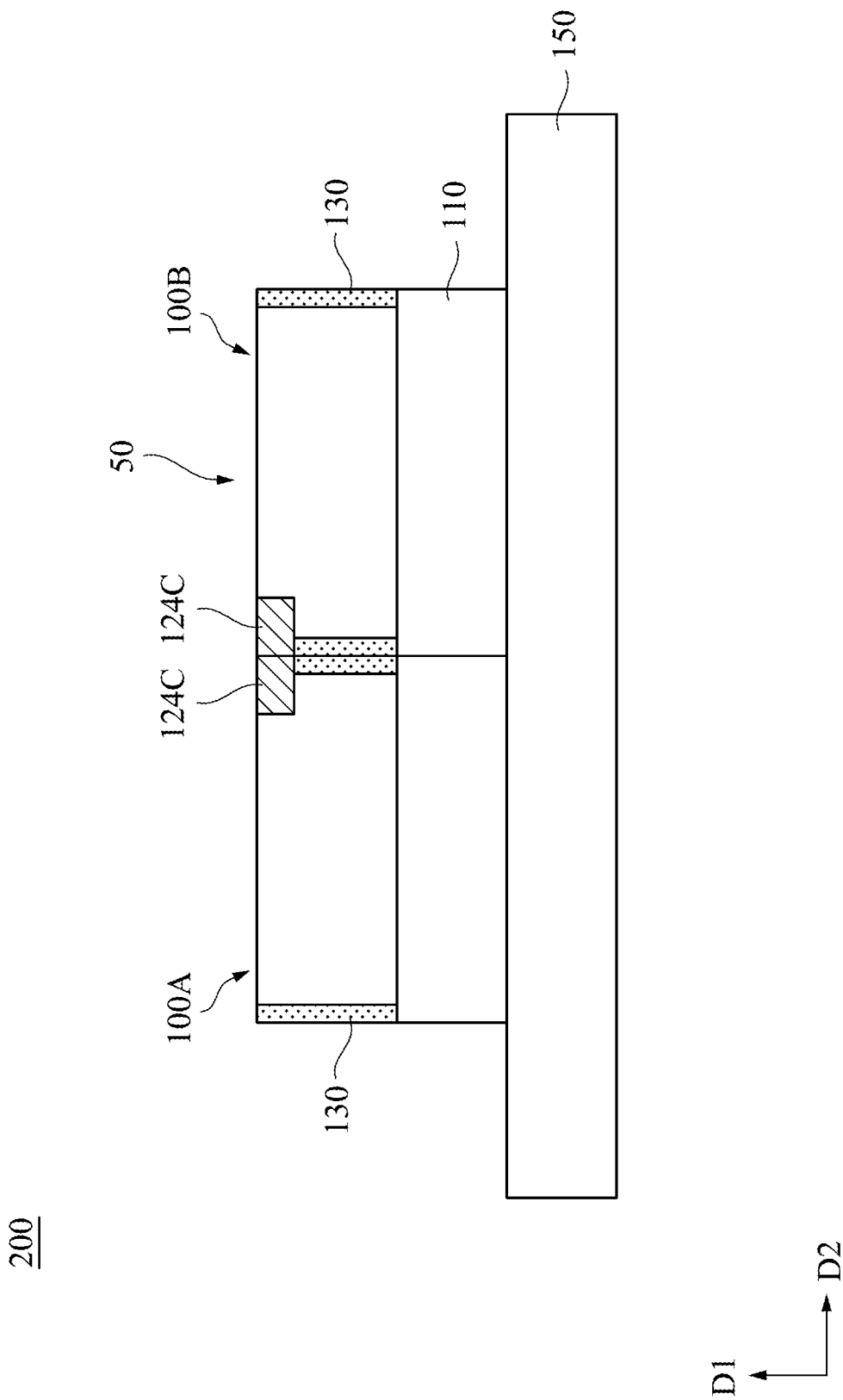
Figure 13B:
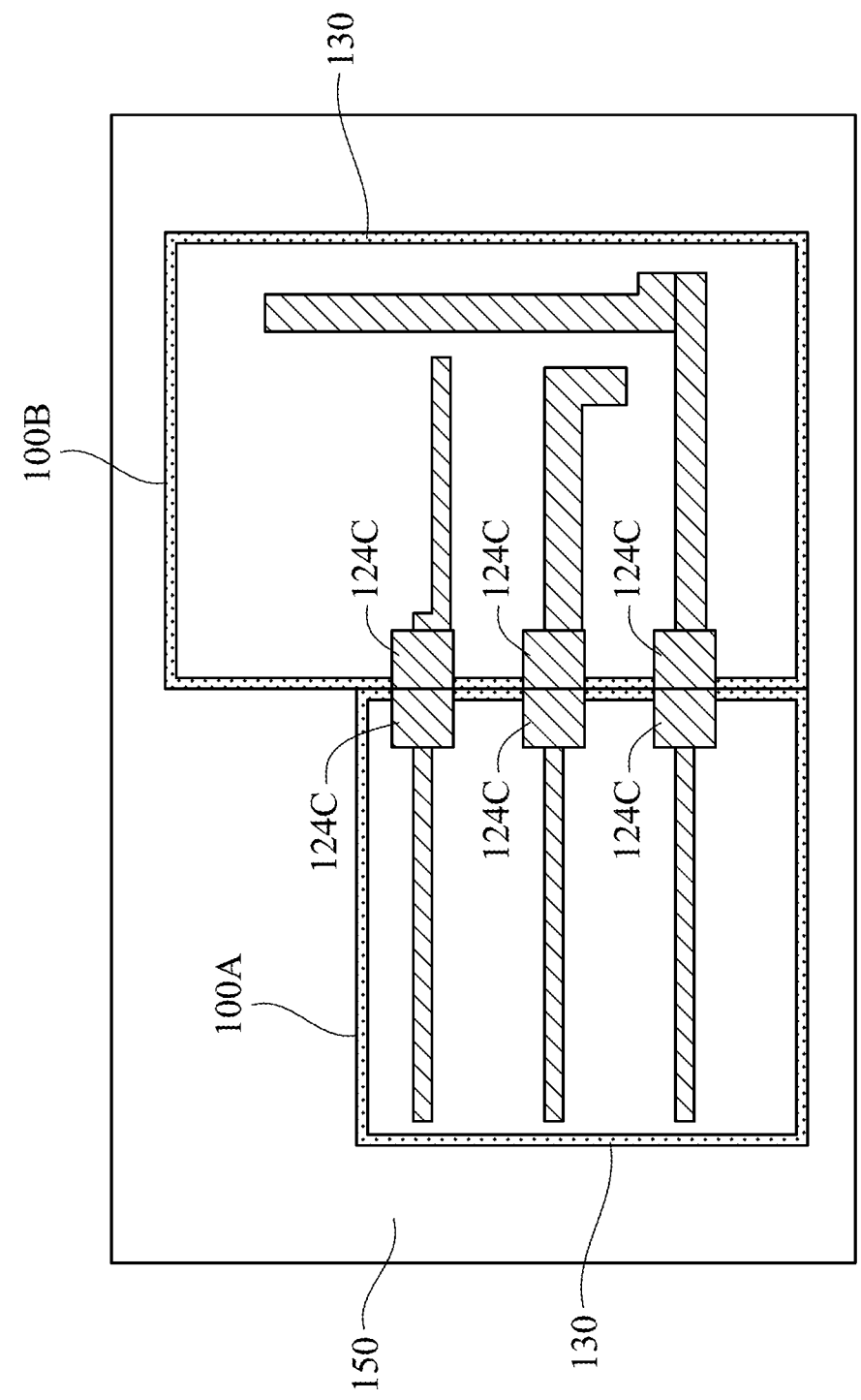

Reference is made to FIG. 5 to FIG. 13B, in which FIG. 5, FIG. 6, FIG. 7, FIG. 8, FIG. 9, FIG. 10, FIG. 11, FIG. 12A, and FIG. 13A are schematic cross-sectional views of different steps of manufacturing a stack structure, according to some embodiments of the invention, and FIG. 12B and FIG. 13B respective are schematic top views of FIG. 12A and FIG. 13A. For the purpose of better understanding, only the silicon substrate 110, the metal contacts 124C, the dielectric layer 128, and the sealing ring 130 are illustrated in the schematic cross-sectional views, and the drawings are not illustrated in a real scale.

Figure 5:
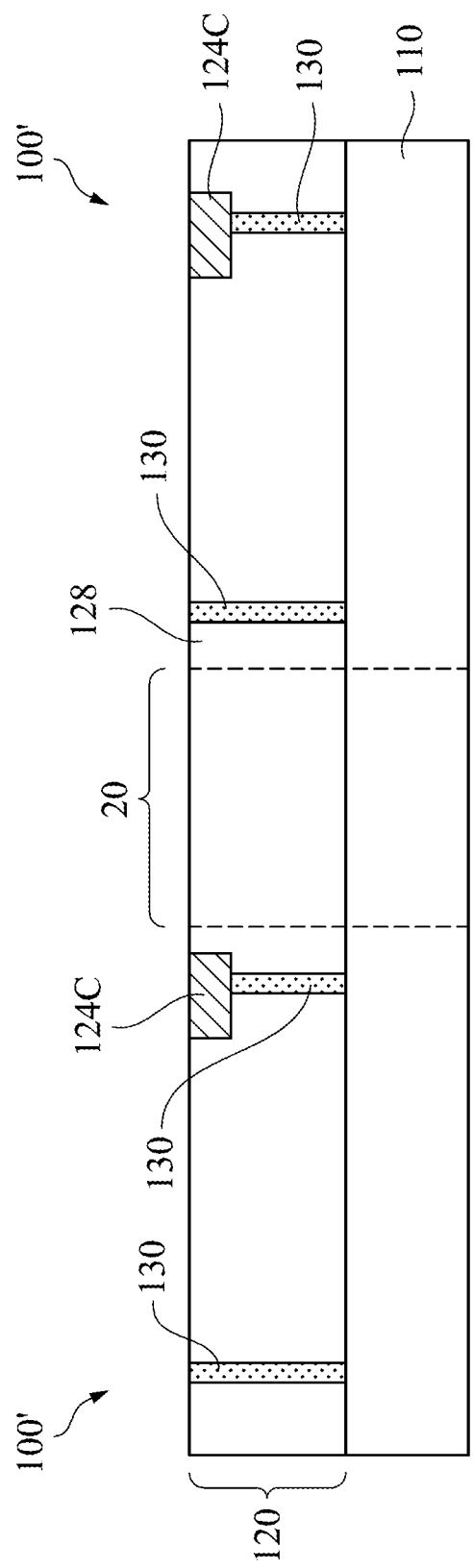
FIG. 5, FIG. 6, FIG. 7, FIG. 8, FIG. 9, FIG. 10, FIG. 11, FIG. 12A, and FIG. 13A are schematic cross-sectional views of different steps of manufacturing a stack structure, according to some embodiments of the invention.

Referring to FIG. 5, the scribe line 20 is defined between the die regions 100'. More particularly, the scribe line 20 includes the portions of the dielectric layer 128 and the silicon substrate 110 between the die regions 100', and there is not interface between the scribe line 20 and the die regions 100'.

Figure 6:
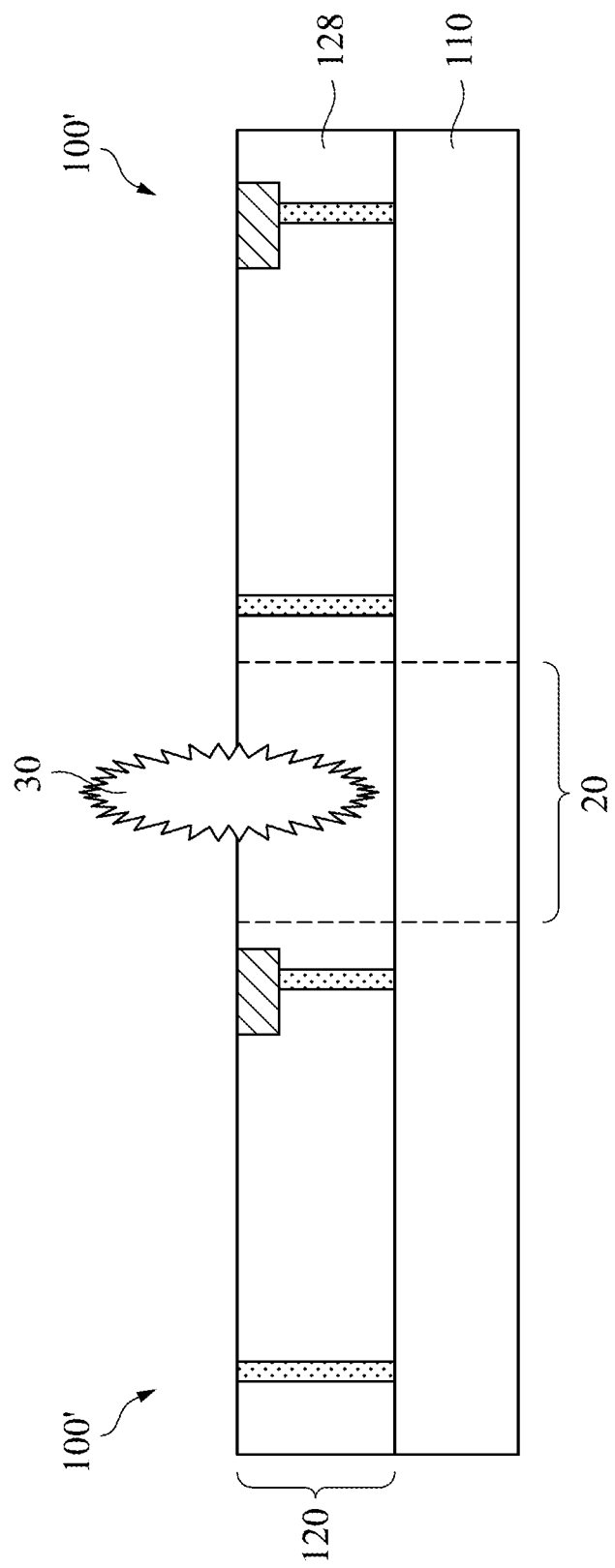

Referring to FIG. 6, a partial dicing process is performed to partially remove the dielectric layer 128 at the scribe line 20. In some embodiments, the partial dicing process is performed by using a blade 30.

Figure 7:
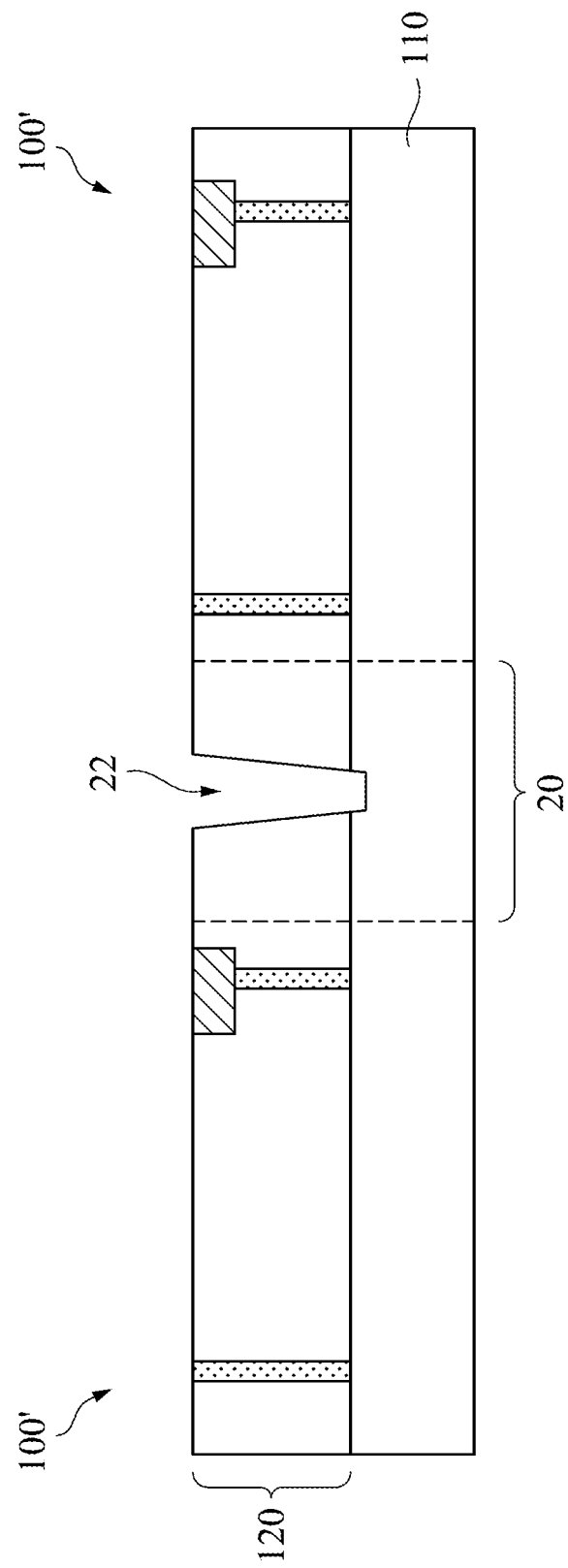

Referring to FIG. 7, the partial dicing process stops at the silicon substrate 110. Namely, the silicon substrate 110 is exposed from the trench 22 cut by the blade, and a portion of the silicon substrate 110 is also removed during the partial dicing process.

Figure 8:
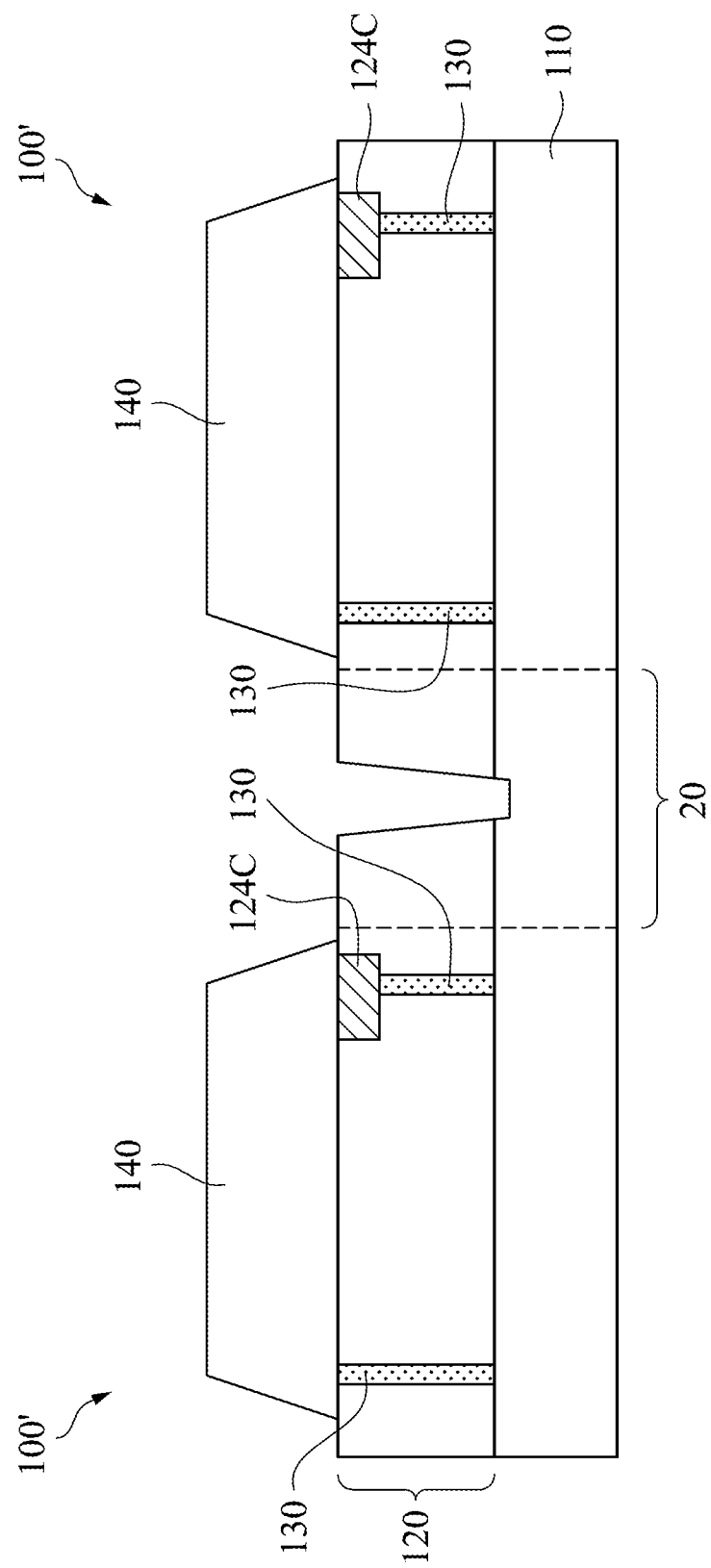

Referring to FIG. 8, a plurality of masks 140 are formed on the die regions 100'. The masks 140 can be patterned photoresist, and the masks 140 can be formed by coating a photoresist material on the structure and then etching the photoresist material. The masks 140 at least cover the area with the sealing ring 130 and the metal contacts 124C. The area of the scribe line 20 is not covered by the masks 140.

Figure 9:
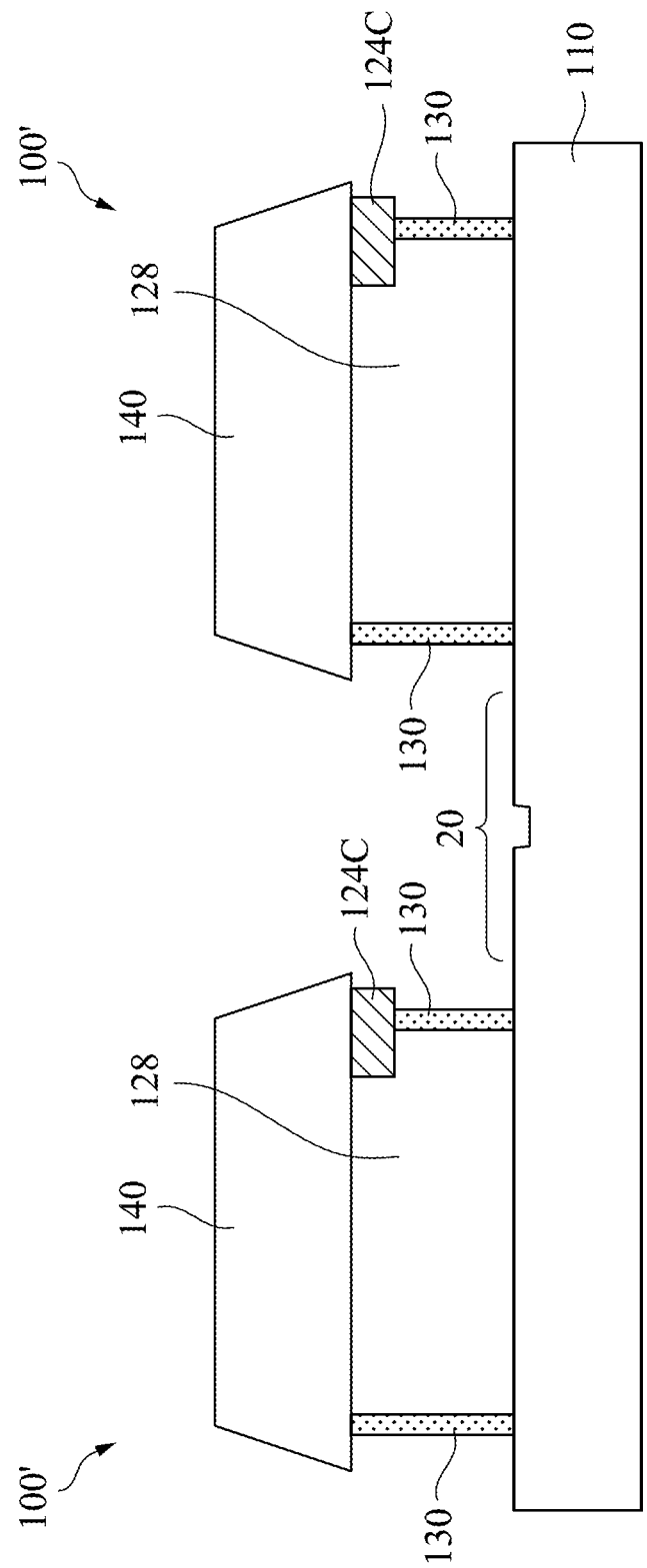

Referring to FIG. 9, an etching process is performed to remove the portion of the dielectric layer 128 uncovered by the masks 140. In some embodiments, the etching process is a wet etching process using an etchant that etches silicon oxide faster than silicon and silicon nitride. Thus the sealing ring 130 can be served as a stop layer, and the sidewall of the sealing ring 130 is revealed after the etching process. In some other embodiments, the etching process is a dry etching process, the portions of the dielectric layer 128 covered by the masks 140 can be remained after the etching process and the exposed portion of the silicon substrate 110 corresponding to the scribe line 20 is thinned.

Referring to FIG. 10, the masks 140 (as shown in FIG. 9) are removed, and a laser cutting process is performed by using a laser 40. The laser cutting process is cut along the sidewall of the sealing ring 130. More particularly, the laser cutting process is performed such that the path of the laser 40 aligns the outer sidewall of the sealing ring 130. The laser cutting process passes through the metal contacts 124C such that portions of the metal contacts 124C are removed after the laser cutting process. After the laser cutting process, the dies 100 are defined, as shown in FIG. 11.

Figure 14:
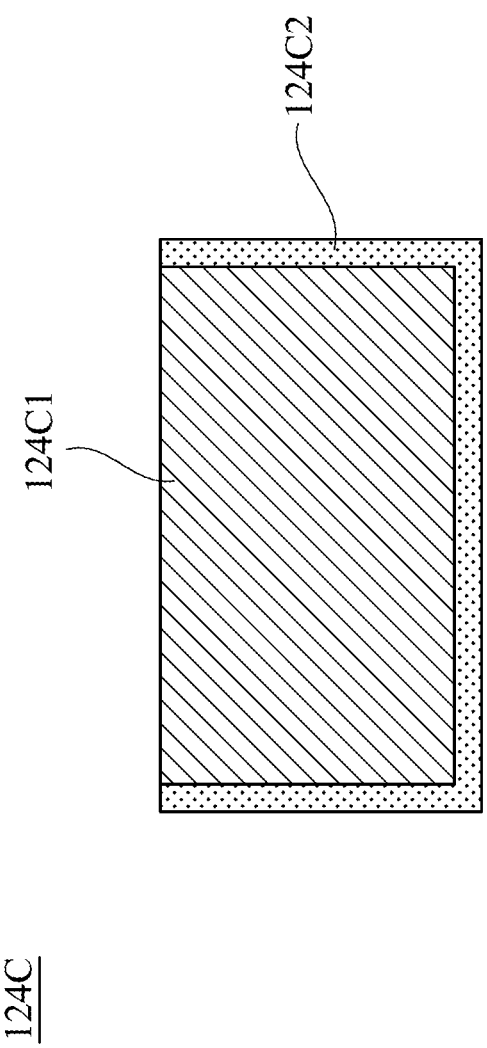
FIG. 14 is the cross-section of the cut metal contact of FIG. 11.

The cross-section of the cut metal contact 124C can be referred to FIG. 14, in which the metal contact 124C includes a filling metal 124C1 and a barrier layer 124C2 lining the filling metal 124C1. The filling metal 124C1 is revealed after the laser cutting process, and the barrier layer 124C2 lining the sidewall and the bottom of the filling metal 124C1. In some embodiments, the material of the filling metal 124C1 can be Cu, and the material of the barrier layer 124C2 can be Ta.

Reference is made back to FIG. 11. The wafer is cut along the along the sidewall of the sealing ring 130. The material of the sealing ring 130 can be nitride such as SiN or SiCN, which has a clear interface between the sealing ring 130 and the dielectric layer 128 (if remained) or between the sealing ring 130 and the silicon substrate 110. Thus the cutting path of the laser cutting process can be well controlled.

In some embodiments, each of the dies 100 has the device layer 120 surrounded by the sealing ring 130, and at least one of the metal contact 124C has an expose surface aligning the sealing ring 130. The sidewalls of the sealing ring 130, the metal contact 124C, and the silicon substrate 110 are coplanar. Because the dies 100 are cut by two-step cutting including the blade cutting and then the laser cutting, the cut surfaces of the dies 100 can be smoother and have better uniformity.

Referring to FIGS. 12A and 12B, a first die 100A from a first wafer and a second die 100B from a second wafer are provided. The first die 100A and the second die 100B are respectively formed by the sequential processes described above. The main difference is that the first die 100A is form by cutting the first wafer, and the second die 100B is form by cutting the second wafer. The sizes of the first die 100A and the second die 100B can be the same or different. The layouts of the first die 100A and the second die 100B can be different. The material of the sealing rings 130 of the first die 100A and the second die 100B are the same, such that the thermal expansion coefficient between the first die 100A and the second die 100B can be balanced.

At the bonding side of the first die 100A and the second die 100B, the number of the metal contacts 124C of the first die 100A and the second die 100B are the same, and the arrangement of the metal contacts 124C of the first die 100A and the second die 100B are symmetric.

After the first die 100A and the second die 100B are positioned to be in contact with each other, a hybrid bonding process is performed, such that each of the metal contacts 124C of the first die 100A is connected to the corresponding one of the metal contacts 124C of the second die 100B.

In some embodiments, the hybrid bonding process includes performing a thermal pressing process to directly bond the metal contacts 124C of the first die 100A and the metal contacts 124C of the second die 100B to each other via a direct metal-metal bonding such as a Cu—Cu bonding, and the sealing rings 130 and the silicon substrate 110 of the first die 100A and the second die 100B are also directly bonded to each other after the thermal pressing process, thereby forming a die bonding structure 50 (see FIG. 13A). After the thermal pressing process, an annealing process is performed to improve the bonding strength and prevent the problem of delamination of the structure.

Optionally, a pre-cleaning process can be performed between the laser cutting process and the hybrid bonding process. In some embodiments, an acidic treatment is applied to the surface of the first die 100A and the second die 100B, such that the metal oxide on the surface of the metal contacts 124C of the first die 100A and the second die 100B can be removed via the acid, and some of the particles and undesirable substances on the surface of the first die 100A and the second die 100B will also be removed.

After the hybrid bonding process, optionally, a thinning process is performed to the die bonding structure 50. For example, the bonded first die 100A and second die 100B can be flip and a gridding process is performed to the silicon substrates 110 of the bonded first die 100A and second die 100B, thereby reducing the thickness of the bonded first die 100A and second die 100B. The thinning process is performed after the hybrid bonding process, such that the bonding strength would not be reduced because of the thinning process.

Referring to FIGS. 13A and 13B, a pick and place process is performed to transfer the die bonding structure 50 on a printed circuit board 150. A die-to-die stack structure 200 is provided, in which the first die 100A and the second die 100B are side-by side bonding. Then a sequential of wiring and encapsulating processes can be further performed to finish the package.

In some embodiments, the die bonding structure 50 including the bonded first die 100A and the second die 100B are stacked on the printed circuit board 150 in the first direction D1, in which the first direction D1 parallel to the normal direction of the main surfaces of the first die 100A, the second die 100B, and the printed circuit board 150. The first die 100A and the second die 100B are bonded in the second direction D2, in which the second direction D2 is perpendicular to the first direction D1. The first die 100A and the second die 100B are laterally bonded by the metal contacts 124C arranged at the sidewalls of the first die 100A and the second die 100B. The metal contacts 124C comprise Cu.

Figure 15:
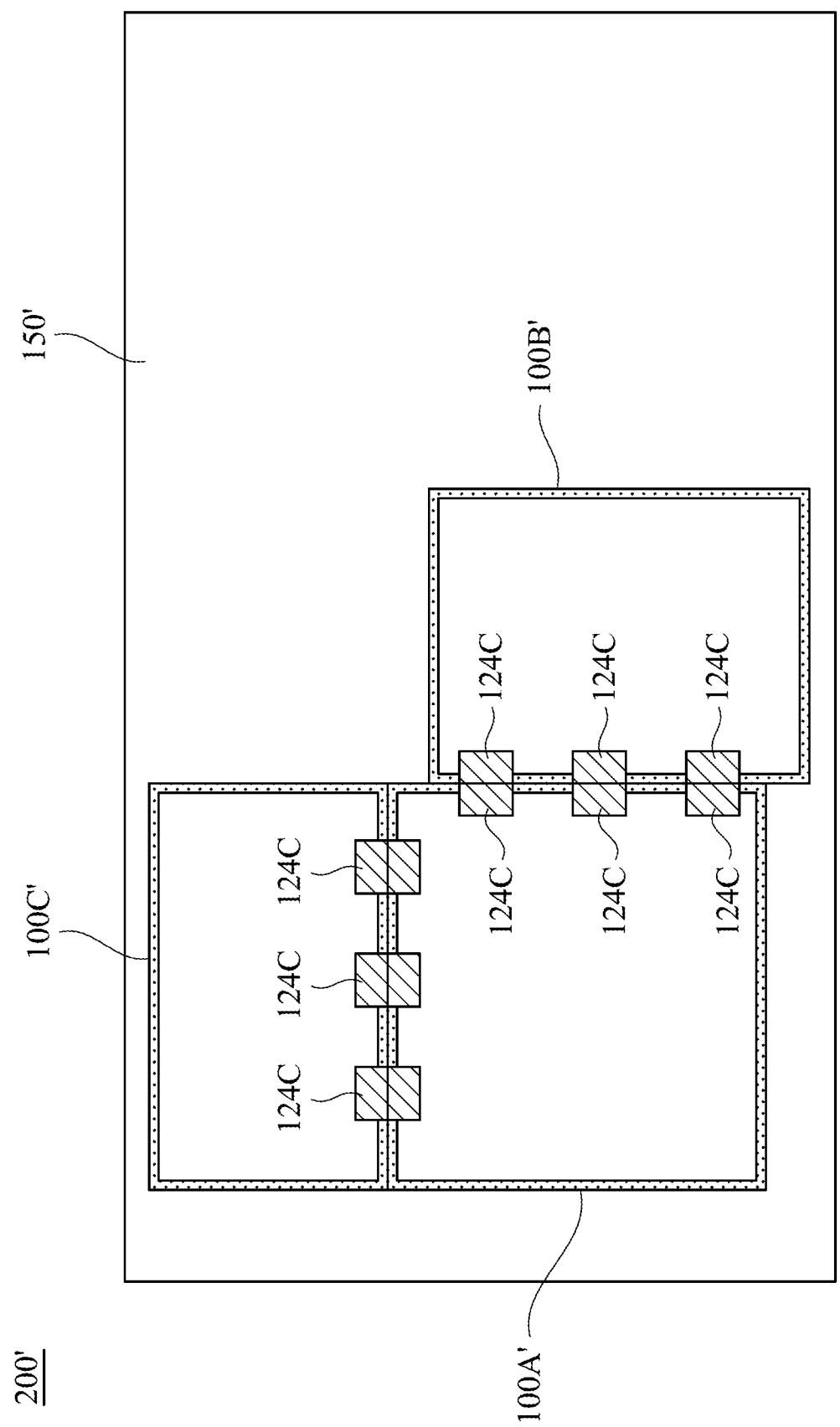
FIG. 15 is a schematic top view of a stack structure, according to some other embodiments of the invention.

Reference is further made to FIG. 15, which is a schematic top view of a stack structure, according to some other embodiments of the invention. The stack structure 200' includes a printed circuit board 150', a first die 100A', a second die 100B', and a third die 100C'. The first die 100A', the second die 100B', and the third die 100C' are laterally bonded side-by-side by the metal contacts 124C at the sidewalls of the first die 100A', the second die 100B', and the third die 100C'. For example, the second die 100B' is bonded to a first sidewall of the first die 100A' by directly bonding a first group of the metal contacts 124C of the first die 100A' to the metal contacts 124C of the second die 100B', and the third die 100C' is bonded to a second sidewall of the first die 100A' by directly bonding a second group of the metal contacts 124C of the first die 100A' to the metal contacts 124C of the second die 100B'. In some embodiments, at least two of the first die 100A', the second die 100B', and the third die 100C' have different sizes. In some embodiments, at least two of the first die 100A', the second die 100B', and the third die 100C' have different layouts.

According to some embodiments of the invention, the dies can be laterally bonded side-by-side via the metal contacts including Cu. The pitch joint can be well controlled by the layout. Additionally, the dies are cut by a blade cutting and a laser cutting, such that the sidewall of the dies are smooth and are benefit to the hybrid bonding process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A die bonding structure, comprising:
  a first die comprising a first sealing ring and a plurality of first metal contacts, wherein sidewalls of a first group of the first metal contacts align a first sidewall of the first sealing ring; and
  a second die comprising a second sealing ring and a plurality of second metal contacts, wherein sidewalls of the second metal contacts align a sidewall of the second sealing ring, the first group of the first metal contacts are directly bonded to the second metal contacts, respectively, and the first sealing ring is directly bonded to the second sealing ring.

2. The die bonding structure of claim 1, wherein the first sealing ring and the second sealing ring comprise the same material.

3. The die bonding structure of claim 1, wherein the first sealing ring and the second sealing ring comprise SiN or SiCN.

4. The die bonding structure of claim 1, wherein the first die and the second die are laterally bonded.

5. The die bonding structure of claim 1, wherein the first metal contacts and the second metal contacts comprise Cu.

6. The die bonding structure of claim 1, wherein the first die comprises an IC device encircled by the first sealing ring.

7. The die bonding structure of claim 1, wherein the second die comprises an IC device encircled by the second sealing ring.

8. The die bonding structure of claim 1, wherein the first die and the second die have different sizes.

9. The die bonding structure of claim 1, wherein the first die and the second die have different layouts.

10. The die bonding structure of claim 1, further comprising:
  a third die comprising a third sealing ring and a plurality of third metal contacts, wherein sidewalls of the third metal contacts align a sidewall of the third sealing ring, and the third sealing ring is directly bonded to the first sealing ring.

11. The die bonding structure of claim 10, wherein sidewalls of a second group of the first metal contacts align a second sidewall of the first sealing ring, and the second group of the first metal contacts are directly bonded to the third metal contacts, respectively.

12. A stack structure, comprising:
  a printed circuit board;
  a first die disposed on the printed circuit board and comprising a first sealing ring and a plurality of first metal contacts; and
  a second die disposed on the printed circuit board and comprising a second sealing ring and a plurality of second metal contacts,
  wherein the first sealing ring is directly bonded to the second sealing ring, and the first metal contacts are directly bonded to the second metal contacts, respectively, and
  wherein a bonding direction of the first die and the second die is perpendicular to a normal direction of the printed circuit board.

13. The stack structure of claim 12, wherein the first die and the second die have different sizes.

14. The stack structure of claim 12, wherein the first die and the second die have different layouts.

15. The stack structure of claim 12, wherein the first sealing ring and the second sealing ring comprise SiN or SiCN.

16. The stack structure of claim 12, wherein the first metal contacts and the second metal contacts comprise Cu.

17. A method of forming a die bonding structure, comprising:
- cutting a first wafer to provide a first die, wherein a first sealing ring and a plurality of first metal contacts are exposed from a sidewall of the first die after cutting the first wafer;
- cutting a second wafer to provide a second die, wherein a second sealing ring and a plurality of second metal contacts are exposed from a sidewall of the second die after cutting the second wafer; and
- bonding the first sealing ring to the second sealing ring and bonding the first metal contacts to the second metal contacts.

18. The method of claim 17, wherein cutting the first wafer is performed by performing a laser cutting, and the laser cutting aligns a sidewall of the first sealing ring.

19. The method of claim 17, wherein cutting the second wafer is performed by performing a laser cutting, and the laser cutting aligns a sidewall of the second sealing ring.

20. The method of claim 17, further comprising pre-cutting the first wafer and the second wafer by a blade.

\* \* \* \* \*